United States Patent
Tsuchiya et al.

(10) Patent No.: US 7,364,616 B2
(45) Date of Patent: Apr. 29, 2008

(54) WAFER DEMOUNTING METHOD, WAFER DEMOUNTING DEVICE, AND WAFER DEMOUNTING AND TRANSFERRING MACHINE

(75) Inventors: Masato Tsuchiya, Gunma (JP); Ikuo Mashimo, Gunma (JP); Koichi Saito, Gunma (JP)

(73) Assignee: Mimasu Semiconductor Industry Co. Ltd, Gunma (JP)

( * ) Notice: Subject to any disclaimer, the term of this patent is extended or adjusted under 35 U.S.C. 154(b) by 217 days.

(21) Appl. No.: 10/554,371

(22) PCT Filed: May 13, 2003

(86) PCT No.: PCT/JP03/05947

§ 371 (c)(1),
(2), (4) Date: Oct. 25, 2005

(87) PCT Pub. No.: WO2004/102654

PCT Pub. Date: Nov. 25, 2004

(65) Prior Publication Data

US 2006/0286769 A1 Dec. 21, 2006

(51) Int. Cl.
*H01L 21/68* (2006.01)

(52) U.S. Cl. .......................... 117/2; 438/458
(58) Field of Classification Search ............. 117/1; 118/1; 257/1; 427/1; 438/1
See application file for complete search history.

(56) References Cited

U.S. PATENT DOCUMENTS 5,690,749 A * 11/1997 Lee ................................ 134/6

6,066,562 A * 5/2000 Ohshima et al. ............ 438/691

FOREIGN PATENT DOCUMENTS

| JP | 09-064152 | * | 3/1997 |
| JP | 9-64152 A | | 3/1997 |
| JP | 2001-114434 A | | 4/2001 |

OTHER PUBLICATIONS

International Search Report, Jun. 17, 2003.

* cited by examiner

*Primary Examiner*—Yogendra N. Gupta
*Assistant Examiner*—Marissa W. Chaet
(74) *Attorney, Agent, or Firm*—McGlew and Tuttle P.C.

(57) ABSTRACT

It is an object of the present invention to provide a wafer release method capable of releasing a wafer safely, simply and certainly and improving a wafer releasing rate, a wafer release apparatus and a wafer release transfer machine using the wafer release apparatus. A wafer release method of the present invention comprises the steps of: pressing the uppermost wafer along an axis direction (L-L') shifted by an angle in the range of from 15 to 75 degrees from a crystal habit line axis (A-A') or (B-B') of the uppermost wafer clockwise or counterclockwise; bending upwardly the peripheral portion of the uppermost wafer so as to cause a bending stress in the uppermost wafer in the axis direction (L-L') shifted by the angle; blowing a fluid into a clearance between the lower surface of the uppermost wafer and the upper surface of the lower wafer adjacent thereto; and raising the uppermost wafer for releasing.

16 Claims, 13 Drawing Sheets

FIG.1
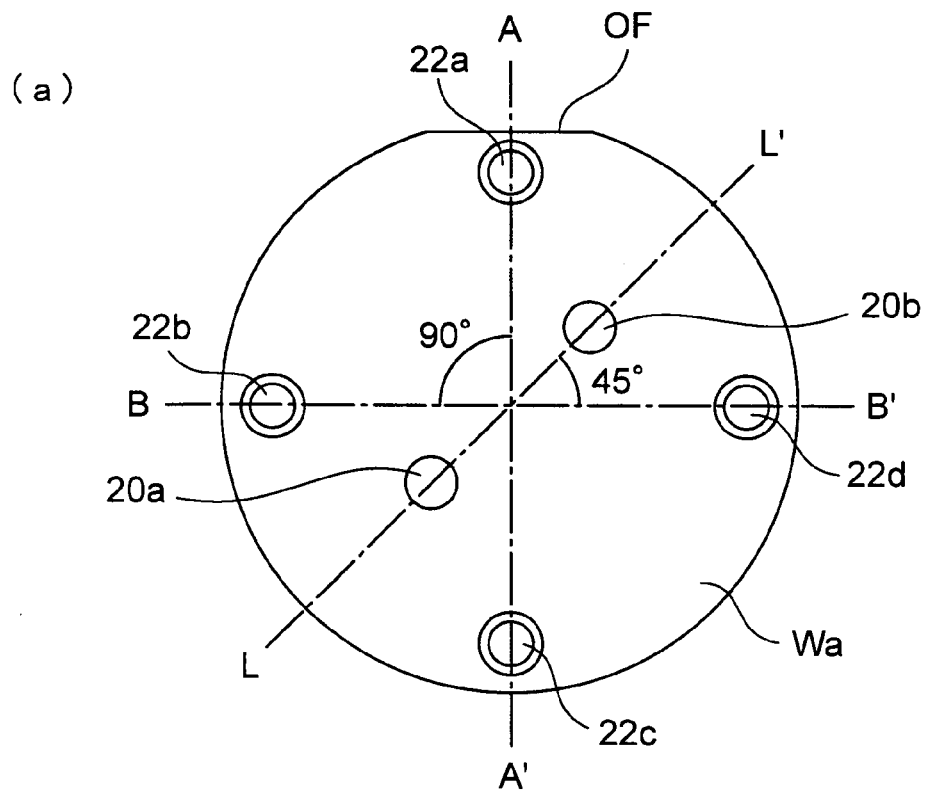
(a)
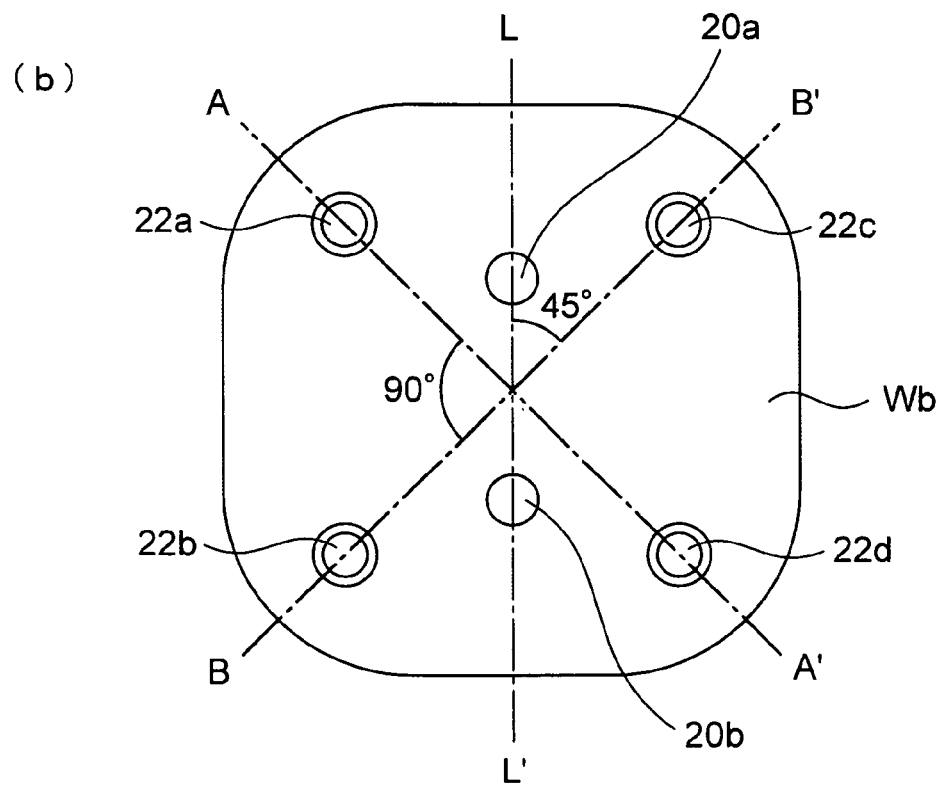
(b)

FIG.2
(a)
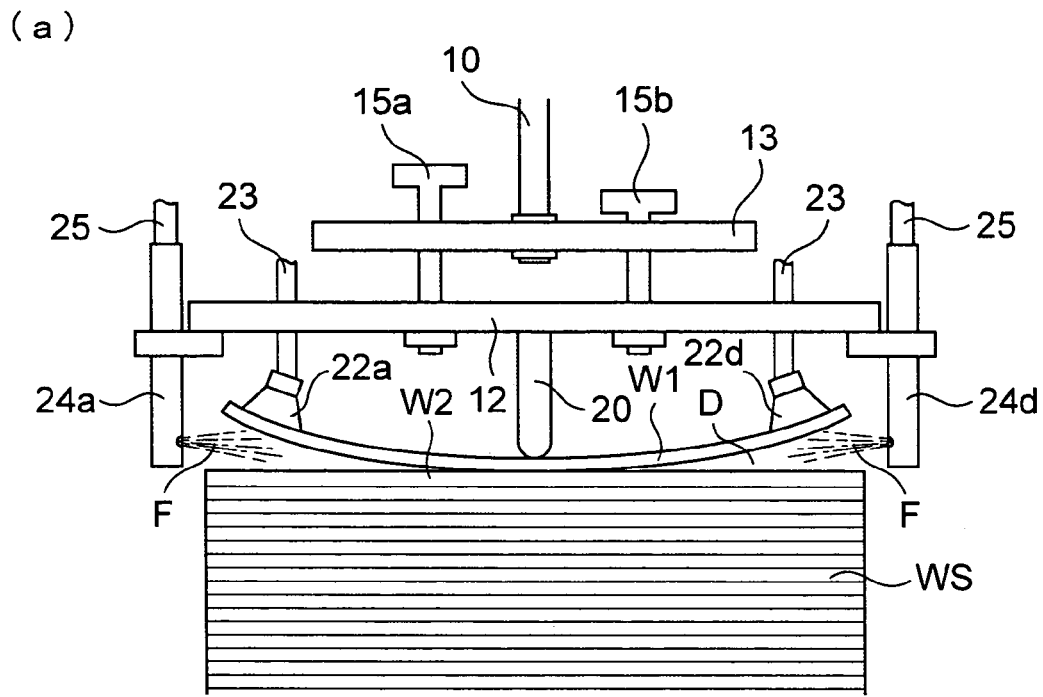
(b)
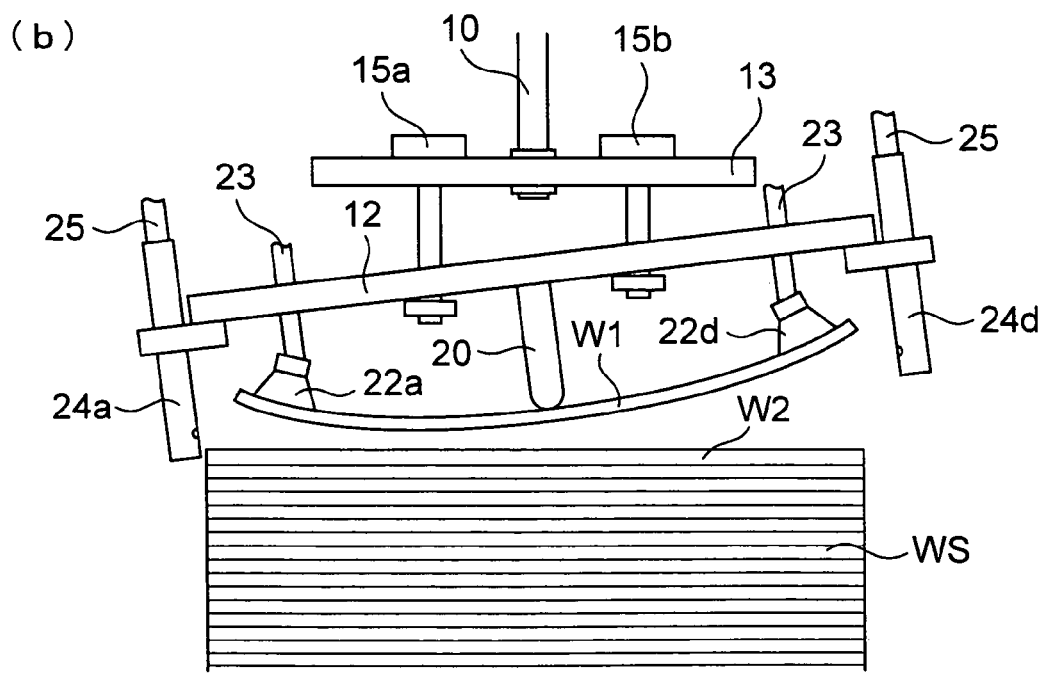

FIG.12
(a)
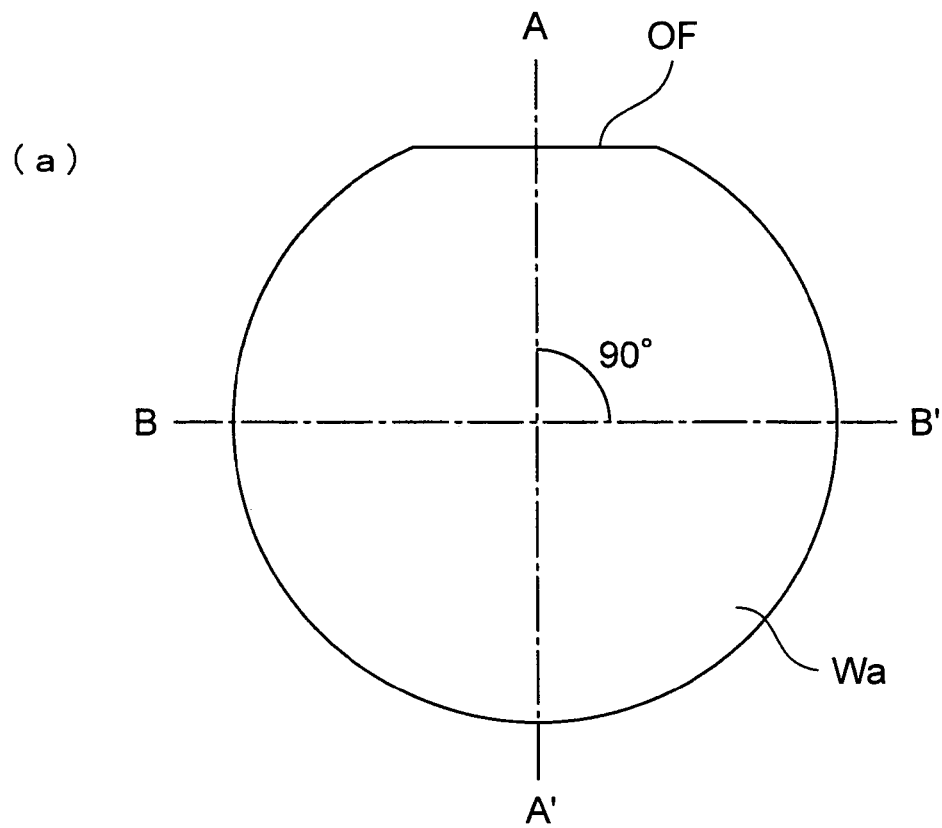
(b)
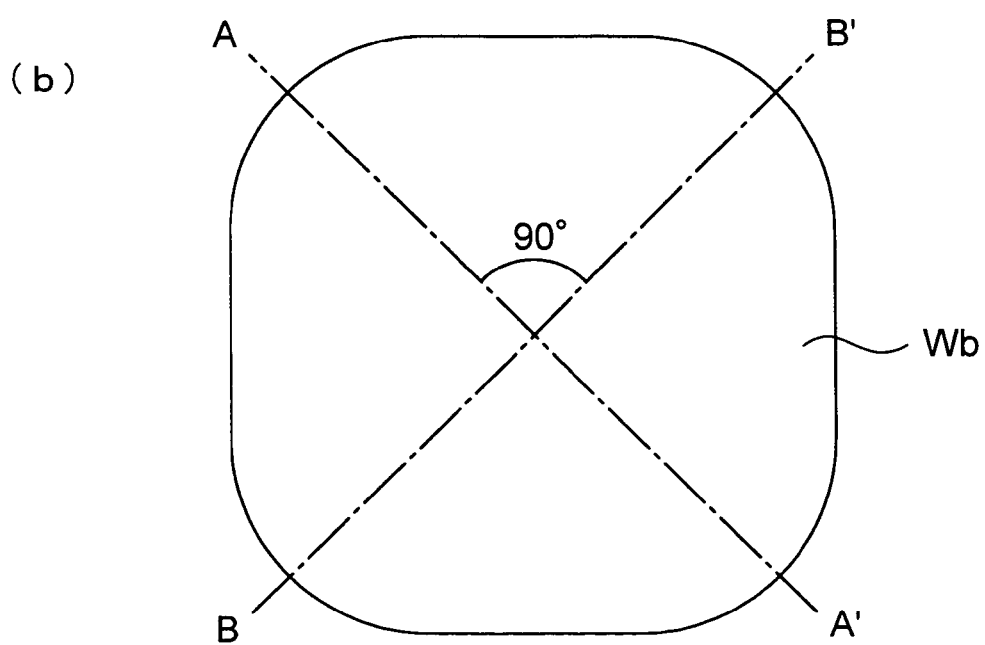

WAFER DEMOUNTING METHOD, WAFER DEMOUNTING DEVICE, AND WAFER DEMOUNTING AND TRANSFERRING MACHINE

TECHNICAL FIELD

The present invention relates to a novel wafer release method capable of releasing safely, simply and certainly the uppermost wafer of a wafer laminate obtained by laminating many or a plurality of wafers, for example, semiconductor wafers such as silicon wafers, especially semiconductor wafers for solar cells, from a lower wafer adjacent to the uppermost wafer of the wafer laminate, a novel wafer release apparatus and a wafer release transfer machine using the wafer release apparatus.

BACKGROUND ART

Conventionally, semiconductor wafers (hereinafter simply referred to as a wafer) such as silicon wafers in the shape of a thin layer cut off by slicing from a silicon ingot are subjected to various kinds of processing after slicing to become final products. In the course of various kinds of processing, many or a plurality of wafers are usually laminated to obtain a wafer laminate (commonly referred to as a coin stack) and wafers are released from the wafer laminate usually one at a time and processing is applied to each wafer.

For example, an abrasive grain agent (slurry) containing oil, however, remains on and clings to the surface of the wafer as sliced from the ingot and in a similar way, a liquid such as oil, in many case, clings on the surface of the wafer subjected to various kinds of processing. In a case where many or a plurality of wafers are laminated, it is possible to move a wafer sideways but it is difficult to release a wafer upwardly from a lower wafer adjacent thereto due to the action of surface tension.

Therefore, the present inventors proposed a wafer release apparatus in which the uppermost wafer of the wafer laminate obtained by laminating many or a plurality of wafers is bended upward at the peripheral portion thereof and the uppermost wafer is raised while a fluid is blown into between the lower surface of the uppermost wafer and the upper surface of the lower wafer adjacent to the uppermost wafer to thereby release a wafer (see JP A No. 9-64152).

Description will be given of the operational principle of the conventional wafer release apparatus with reference to FIG. 11. There is pressed by a wafer pressing means 120 a center portion of the uppermost wafer W1 of the wafer laminate WS obtained by laminating many or a plurality of wafers. Then, the peripheral portion of the wafer W1 is vacuum chucked by the action of wafer vacuum chuck means 22a and 22b to thereby bend the peripheral portion of the wafer W1 upwardly. A fluid F (water and/or air) is blown into a clearance D between the lower surface of the uppermost wafer W1 and the lower wafer adjacent to uppermost wafer W, and at the same time the uppermost wafer W1 is raised to thereby release the wafer W1 from the wafer laminate WS.

Even with the conventional wafer release apparatus, wafers can be released from the wafer laminate one at a time easily and certainly, whereas a bending stress is generated in a portion indicated with a symbol S in FIG. 11, which has been led to an accident of breakage of the wafer at times.

The present inventor proposed a wafer release apparatus already in which two pairs or more (for example 4 points) of chucking positions that belong into a peripheral portion of an upper surface of a wafer and face each other with the central portion of the wafer are vacuum chucked to thereby bend the peripheral portion upwardly and thus a bending stress generated in the wafer is dispersed to thereby enable the wafer to be released safely, simply and certainly, and moreover it is devised to increase the rate for operating the release (International application number: PCT/JP02/12753). However, the apparatus still has a case of an accident of wafer breakage on which the inventor has conducted repeated serious studies in order to get more improvement, with the result that the following findings are obtained.

Wafers are obtained by growing a single crystal rod (ingot) of silicon grown by means of a CZ (Czochralski) method or an FZ (Floating Zone) method, shaping the as-grown single crystal rod into a cylindrical form with a cylinder grinding apparatus and thereafter, slicing the single crystal cylinder into thin pieces in a direction almost normal to the rod axis with wire saw or the like.

When the crystal growth of the silicon single crystal is conducted, for example, by means of the CZ method in the crystal orientation <100>, crystal habit lines L formed with the crystal planes {100} appear on the outer surface of the ingot G. Since an angle between the crystal planes {100} is 90 degrees, 4 crystal habit lines L in total are formed as ridges (linear protrusions) with a height of the order of several mm in the length direction on the outer surface of the ingot G at an angular spacing of 90 degrees when viewed in the direction of the rod axis of the ingot G.

In a wafer sliced from an ingot grown in the crystal direction <100>, for example, a disc-like wafer Wa as shown in FIG. 12(a), axes on which crystal habit lines are formed (this axis is hereinafter referred to as a crystal habit line axis), that is in the embodiment of the figure, a segmental axis indicated with a symbol A-A' and a segmental axis indicated with a symbol B-B', cross each other at a right angle in the central portion of the wafer, and an OF (Orientation Flat) is formed on the outer surface of the wafer so as to correspond to the crystal habit line axis. As shown in FIG. 12(b), in a wafer Wb used in fabrication of a solar cell which has been increased in production thereof in recent years, the wafer Wb itself is worked in the almost square shape and sliced such that the crystal habit line axes (in the embodiment of the figure, a segmental axis indicated with a symbol A-A' and a segmental axis indicated with a symbol B-B' are on diagonal lines of the wafer.

These wafers have a property that they are easy to be cleaved along a direction parallel to a crystal habit line axis. Therefore, in a case where a wafer is released from a wafer laminate, in the course of bending the peripheral portion of the wafer upwardly if a portion where a bending stress occurs and a crystal habit line axis coincide, cleavage occurs very easily; therefore, even if two or more pairs (for example, 4 points) of vacuum chuck positions facing each other on the peripheral portion of the upper surface with the central portion of the wafer are vacuum chucked and the periphery portion is bent upwardly so as to disperse a bending stress generated in a wafer as in the above-mentioned proposal, such accidents as wafer breakage are not avoidable.

When slurry remains on and clings to a surface of a wafer, which is observed just after the wafer is sliced from an ingot, water can be preferably used as a fluid blown into a clearance between the lower surface of the uppermost wafer and the upper surface of the lower wafer adjacent thereto. However, when releasing, the wafer is pulled in a direction opposite to the releasing direction due to surface tension of water. Moreover, when releasing simply upwardly, a portion where the bending stress occurs and a portion where surface tension of water works coincide each other; therefore, an accident of wafer breakage occurs easily.

If an accident of wafer breakage occurs once, as a matter of course, a yield of products decreases. Since chips from broken wafers are scattered on the wafer release apparatus, the operation is temporarily stopped and the scattered chips from the broken wafer are necessarily collected by hand, which leads to a cause of great decrease in productivity.

The present invention has been made in light of the problem and it is an object of the present invention to provide a wafer release method capable of releasing a wafer safely, simply and certainly and improving a wafer releasing rate, a wafer release apparatus and a wafer release transfer machine using the wafer release apparatus.

DISCLOSURE OF THE INVENTION

In order to solve the above-described problem, the present invention provides a wafer release method in which the uppermost wafer is released from a wafer laminate obtained by laminating many or a plurality of wafers, comprising the steps of pressing the uppermost wafer along an axis direction shifted by an angle in the range of from 15 to 75 degrees from a crystal habit line axis of the uppermost wafer clockwise or counterclockwise; bending upwardly the peripheral portion of the uppermost wafer so as to cause a bending stress in the uppermost wafer in the axis direction shifted by the angle; blowing a fluid into a clearance between the lower surface of the uppermost wafer and the upper surface of the lower wafer adjacent thereto; and raising the uppermost wafer for releasing.

The angle of the axis direction shifted from the crystal habit line axis of the uppermost wafer clockwise or counterclockwise is preferably in the range of from 30 to 60 degrees, more preferably in the range of from 40 to 50 degrees and most ideally 45 degrees shifted from a crystal habit line axis clockwise or counterclockwise. In a case of a wafer with a crystal orientation <100>, since the crystal habit line axes intersect normal to each other at the central portion of the wafer, the wafer cleaves with the most difficulty when it is bent along a support axis a direction of which is shifted by 45 degree from the crystal habit line axis clockwise or counterclockwise.

When raising and releasing the uppermost wafer, the uppermost wafer is preferably raised in the state of being inclined relative to a horizontal direction. By raising the uppermost wafer in the state of being inclined relative to a horizontal direction, a portion where surface tension of water generating between the lower surface of the uppermost wafer and the upper surface of the lower wafer adjacent thereto works is shifted from a portion where a bending stress occurs in the uppermost wafer; therefore there is no chance to cause an accident of wafer breakage due to the surface tension of water.

Also, the present invention provides a wafer release apparatus for releasing the uppermost wafer from a wafer laminate obtained by laminating many or a plurality of wafers, comprising: a support plate provided so as to be movable vertically; a wafer pressing means provided on the lower surface of the support plate; a wafer vacuum chuck means provided on the peripheral portion of the lower surface of the support plate, and for vacuum chucking one or more pairs of vacuum chuck positions facing each other on the peripheral portion of the upper surface of the uppermost wafer; and a fluid jet means provided outside the wafer vacuum chuck means and corresponding thereto; wherein the uppermost wafer is pressed with the wafer pressing means along an axis direction shifted by an angle in the range of from 15 to 75 degrees from a crystal habit line axis of the uppermost wafer clockwise or counterclockwise, the uppermost wafer is vacuum chucked by the vacuum chuck means on the peripheral portion of the upper surface thereof at one or more pairs of vacuum chuck positions facing each other with the center portion of the wafer, with the result that the uppermost wafer is bent upwardly at one or more pairs of the vacuum chuck positions so as to cause a bending stress in the uppermost wafer in the axis direction shifted by the angle, a fluid is blown into a clearance between the lower surface of the uppermost wafer and the upper surface of the lower wafer adjacent thereto with the fluid jet means, and the uppermost wafer is raised for releasing.

As already described, the angle of the axis direction shifted from the crystal habit line axis of the uppermost wafer clockwise or counterclockwise is preferably in the range of from 30 to 60 degrees, more preferably in the range of from 40 to 50 degrees and most preferably 45 degrees shifted from a crystal habit line axis clockwise or counterclockwise.

It is preferable that the wafer pressing means is constituted of a plurality of wafer pressing members provided in one direction on the lower surface of the support plate, or a long wafer pressing member provided in one direction on the lower surface of the support plate. That is, the wafer pressing means in a conventional wafer release apparatus works as the supporting point for supporting one point in the central portion when the wafer is bent, whereas since the wafer pressing means of the present invention works as the supporting axis when the wafer is bent and serves as a supporting axis for supporting the prescribed axis direction of the wafer, it is necessary that the wafer is supported not with a point but along the axis direction.

It is preferable that the two or more pairs of wafer vacuum chuck means are provided and the uppermost wafer is vacuum chucked by the vacuum chuck means on the peripheral portion of the upper surface thereof at two or more pairs of vacuum chuck positions facing each other with the center portion of the wafer, with the result that the uppermost wafer is bent upwardly at two or more pairs of the vacuum chuck positions.

The support plate is preferably formed in the shape of a cross, a letter X or a letter H and the wafer vacuum chuck means is provided on the peripheral portion of the lower surface of the support plate.

The support plate is preferably provided so as to be inclined relative to a horizontal direction while being moved upwardly. As stated above, the uppermost wafer is raised while being inclined relative to a horizontal direction during release operation, so that the surface tension of water can be reduced. In order to realize such a state, the support plate is provided so as to be inclined relative to the horizontal direction while being moved upwardly, with the result that the wafer vacuum chuck means and the wafer pressing means provided on the support plate are similarly inclined relative to the horizontal direction, so that the uppermost wafer can be inclined relative to a horizontal direction while the uppermost wafer is raised being vacuum chucked by the wafer vacuum chuck means.

The fluid may be water and/or air and is preferably alternately blown at prescribed time intervals. At first, water is blown to the wafer to thereby clean off slurry or the like clinging to or remaining on the wafer so that the wafer is easily releasable and thereafter air is blown instead of water, with the result that remaining water is flown away by the air and an effect that the surface tension of water is decreased may be expected, which results in a preferred embodiment.

It is preferable that the wafer vacuum chuck means is a vacuum chuck nozzle with a liquid jet function and a liquid is jetted from the vacuum chuck nozzle to clean the vacuum chuck positions on the uppermost wafer of the wafer laminate. On the silicon wafer or the like in the shape of a thin layer sliced from a silicon ingot or the like, a liquid such as slurry used when slicing the ingot remains and clings. The liquid such as slurry remaining on the wafer is half dried on a surface of the wafer with passage of time; therefore, vacuum chucking with the wafer vacuum chuck means fails or results in incomplete chucking, which renders vacuum chucking very unstable. Therefore, as stated above, the liquid is jetted from the vacuum chuck nozzle to thereby clean the vacuum chuck positions, so that there may be canceled inconveniences such as failure of vacuum chucking, incomplete vacuum chucking.

The wafer vacuum chuck means is vacuum chuck nozzles having a liquid jet function, and it is preferable that a liquid is jetted from the vacuum chuck nozzles to thereby clean pipes communicating with the vacuum chuck nozzles. As stated above, since a liquid such as slurry when slicing remains on the wafer, the liquid such as slurry is sucked into the pipes communicating with the vacuum chuck nozzles while the wafer is vacuum chucked, with the result that the pipe is contaminated and clogged, which leads to malfunction. Therefore, by jetting a liquid from the vacuum chuck nozzles to clean pipes, such malfunction can be prevented.

It is preferable that the wafer vacuum chuck means is vacuum chuck nozzles having a liquid jet function, a liquid is jetted from the vacuum chuck nozzles and the wafer vacuum chuck means temporarily hovers above the wafer surface. A semiconductor wafer such as a silicon wafer is fragile and easily broken with a shock or the like. Especially, in a case where the wafer vacuum chuck means is moved down to be brought into contact with the wafer surface and then the wafer is vacuum chucked, the wafer vacuum chuck means rapidly falls to collide with the wafer surface to thereby break the wafer if the wafer vacuum chuck means falls simply by gravity. Therefore, if the wafer vacuum chuck means is fallen while a liquid is jetted from the vacuum chuck nozzle and temporarily hovers above the wafer surface, then the wafer is prevented from being broken.

A wafer release transfer machine of the present invention comprises: one or more units of the wafer release means each constituted of the above-mentioned wafer release apparatus; a wafer laminate holding means for holding a wafer laminate obtained by laminating many or a plurality of wafers; a wafer transfer means for receiving a wafer released by the wafer release means and for transferring the received wafer to a wafer accommodating cassette; and wafer accommodating cassette placing means movable vertically for placing the wafer accommodating cassettes.

The wafer release transfer machine preferably comprises: two wafer release means; and the wafer transfer means and the wafer accommodating cassette placing means corresponding to the respective two wafer release means, wherein while one of the two wafer release means performs the release operation, the other wafer release means transfers the released wafer to the wafer transfer means. Thereby, there is no idle means, which increases processing efficiency.

An immersion bath is preferably provided such that the wafer accommodating cassettes are immersed in a liquid when the wafer accommodating cassette placing means is located at the lowest position. If the immersion bath is filled with pure wafer or a chemical liquid, contamination prevention and cleaning of the wafer may also be realized, which results in a highly convenient embodiment.

BRIEF DESCRIPTION OF THE DRAWINGS

FIGS. 1(a) and 1(b) are top plan views each showing a vacuum chuck position when a wafer is released by means of a wafer release method of the present invention, wherein FIG. 1(a) shows a case of s disk-like wafer, and FIG. 1(b) shows a case of an almost tetragonal wafer.

FIGS. 2(a) and 2(b) are descriptive, conceptual side views each showing an operation principle that a wafer is inclined relative to a horizontal direction when being released in the wafer release method of the present invention, wherein FIG. 2(a) shows a state where the wafer is vacuum chucked and thereby bent and FIG. 2(b) shows a state where the wafer is inclined relative to a horizontal direction when released.

FIGS. 12(a) and 12(b) are plan views each showing crystal habit line axes of a wafer with a crystal orientation <100>.

BEST MODE FOR CARRYING OUT THE INVENTION

Figure 3:
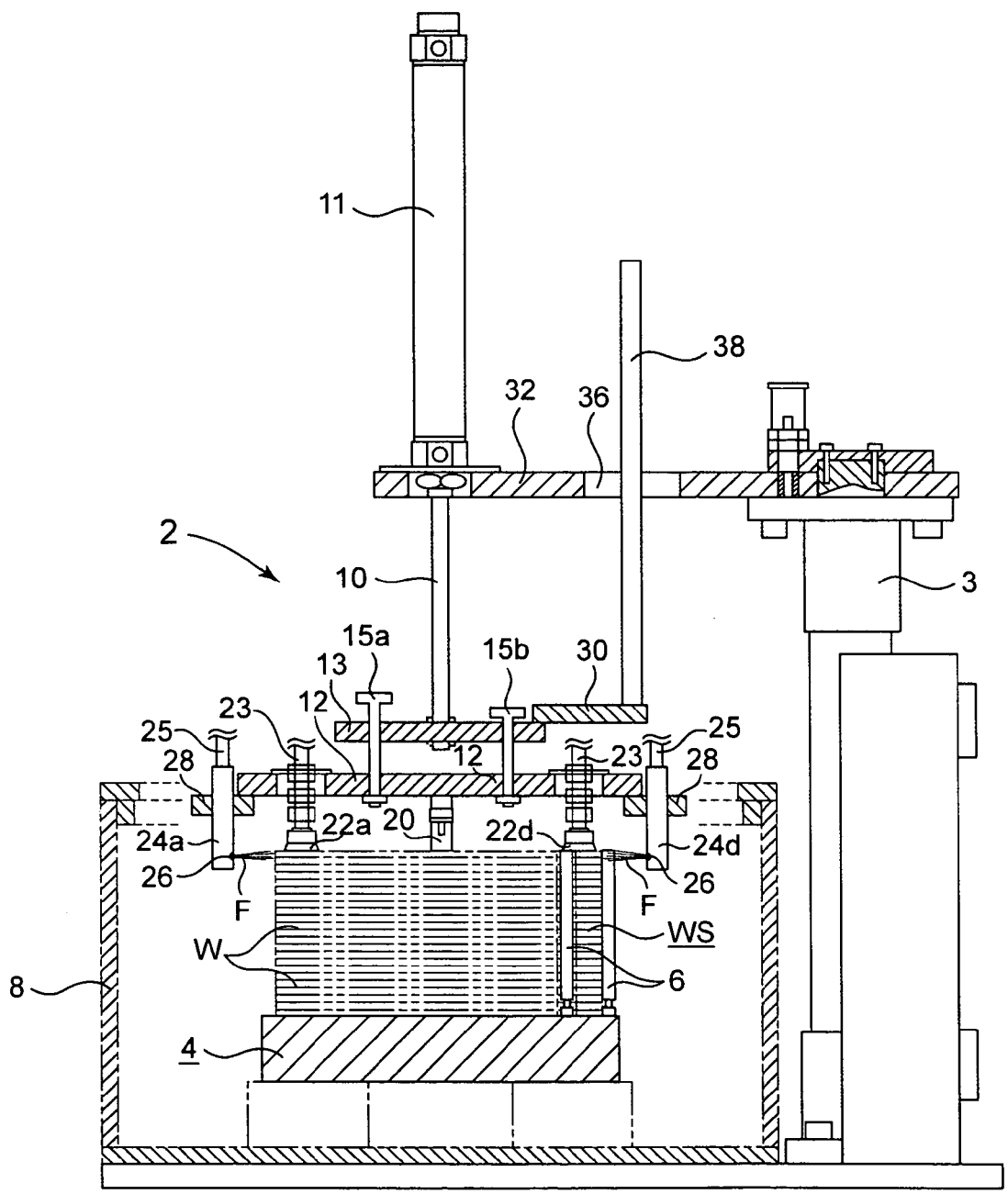
FIG. 3 is a descriptive, partially sectional side view showing a case where a support plate of a wafer release apparatus of the present invention at a moving down position.

Description will be given of embodiments of the present invention below and it is needless to say that the description below is presented by way of illustration only and should not be taken by way of limitation. Incidentally, in FIGS. 1(a) and 1(b) to FIG. 10, components identical with or similar to those shown in FIG. 11 to FIGS. 12(a) and 12(b) may be denoted by the same reference symbols or similar ones.

FIGS. 1(a) and 1(b) are top plan views showing vacuum chuck positions when a wafer is released by means of a wafer release method of the present invention, wherein FIG. 1(a) shows a case of a disc-like wafer, and FIG. 1(b) shows an almost tetragonal wafer.

In FIG. 1(a), a reference symbol Wa is a disk-like wafer and the wafer with a crystal orientation <100>. A segment showing with a symbol A-A' and a segment showing with a symbol B-B' are crystal habit line axes and cross each other at a right angle in the central portion of the wafer. An OF (orientation flat) corresponding to the crystal habit line axis is provided on the outer periphery.

Wafer pressing members 20a and 20b as wafer pressing means 20 press the wafer along an axis direction (a direction of a segment indicated with a symbol L-L') shifted by 45 degree from a crystal habit line axis, and two pairs of vacuum chuck positions on the periphery portion of the upper surface of the wafer Wa facing each other with the central portion of the wafer are also vacuum chucked with a pair of wafer vacuum chuck means 22a and 22b and a pair of wafer vacuum chuck means 22c and 22d.

Then, the wafer Wa is bent with a pair of the wafer vacuum chuck means 22a and 22b and a pair of the wafer vacuum chuck means 22c and 22d with the axis direction (the axis direction of a segment indicated with a symbol L-L') along which the wafer pressing member 20a and 20b press the wafer as a support axis to thereby generate a bending stress only in a portion along the axis direction (the axis direction of the segment indicated with the symbol L-L') shifted by 45 degrees from the crystal habit line axis and harder to be cleaved. Thereby, since no bending stress is generated along the crystal habit line axis along which cleavage easily occurs (the segment indicated with the symbol A-A' and the segment indicated with the symbol B-B'), accidents of wafer breakage decreases and the wafer can be released safely and certainly.

In FIG. 1(*b*), a reference symbol Wb indicates a wafer for fabrication of a solar cell in the almost square shape. In a case of the wafer Wb, a crystal habit line axis (a segment indicated with a symbol A-A' and a segment indicated with a symbol B-B') is on a diagonal line of the wafer.

In a case of the wafer Wb as well, in a similar way to that in FIG. 1(*a*), the wafer pressing members 20a and 20b as the wafer pressing means 20 press the wafer along an axis direction (a direction of a segment indicated with a symbol L-L') shifted by 45 degree from the crystal habit line axis, and two pairs of vacuum chuck positions on the periphery portion of the upper surface of the wafer Wb facing each other with the central portion of the wafer are also vacuum chucked with a pair of wafer vacuum chuck means 22a and 22b and a pair of wafer vacuum chuck means 22c and 22d.

Thereby, since a bending stress is generated only in a portion along an axis direction shifted by 45 degree from the crystal habit line axis along which cleavage occurs with difficulty (the axis direction of a segment indicated with a symbol L-L'), the wafer can be released safely and certainly.

FIGS. 2(*a*) and 2(*b*) are descriptive, conceptual side views showing an operation principle that a wafer is inclined relative to a horizontal direction when being released in a wafer release method of the present invention, wherein FIG. 2(*a*) shows a state where a wafer is vacuum chucked and bent and FIG. 2(*b*) shows a state where a wafer is inclined relative to a horizontal direction when being released.

In FIGS. 2(*a*) and 2(*b*), a reference symbol WS indicates a wafer laminate obtained by laminating many or a plurality of wafers. Reference symbol 10 indicates a movable member that is vertically movable above the wafer laminate WS, for example, a cylinder rod of an air cylinder. The movable member 10, that is the cylinder rod falls by gravity when the air cylinder is turned off, while the cylinder rod rises when the air cylinder is turned on.

A support base plate 13 is attached to the lower end of the movable member 10. The support plate 12 is attached to the support base member 13 by bolts 15a and 15a with idle clearances and the bolts 15a and 15b have respective idle clearances different from each other. For example, the bolts 15a and 15b are different in length from each other and the bolt 15a is mounted so as to have a larger idle clearance than the bolt 15b.

A wafer pressing means 20 is provided on the lower surface of the support plate 12. As stated above, the wafer pressing means includes the wafer pressing members 20a and 20b (see FIG. 1), and presses a prescribed axis direction of the wafer W1. The wafer suction means 22a, 22b, 22c and 22d are provided on the peripheral portion of the lower surface of the support plate and fluid jet means 24a, 24b, 24c and 24d are provided outwardly therefrom corresponding to the respective suction means 22a, 22b, 22c and 22d (see FIG. 5).

At first, the uppermost wafer W1 of the wafer laminate WS is pressed by the wafer pressing means 20 along an axis direction shifted by 45 degrees from the crystal habit line axis of the wafer W1 (an axis direction of the segment indicated with the symbol L-L'). Then, the peripheral portion of the wafer W1 is bent upwardly with the wafer pressing means 20 as a support axis by vacuum chucking the peripheral portion of the wafer W1 using a pair of the wafer vacuum chuck means 22a and 22b and a pair of wafer vacuum chuck means 22c and 22d. A fluid F (water and/or air) is blown into a clearance D between the lower surface of the uppermost wafer and the upper surface of the lower wafer adjacent to the uppermost wafer (FIG. 2(*a*)).

Then, when the movable member 10 is raised, the support plate 12 is inclined to the side of the bolt having a larger idle clearance relative to the horizontal direction; the wafer W1 assumes a state of inclination relative to the horizontal direction (FIG. 2(*b*)). Therefore, when the uppermost wafer W1 is released from the lower wafer W2 adjacent thereto, the surface tension of water works in a portion shifted to the side of the bolt 15a rather than in a portion where a bending stress is generated, which causes no coincidence between a portion where the surface tension of wafer works and a portion in the uppermost wafer in which a bending stress is generated, and hence an accident of wafer breakage due to the surface tension of water occurs with difficulty.

Figure 4:
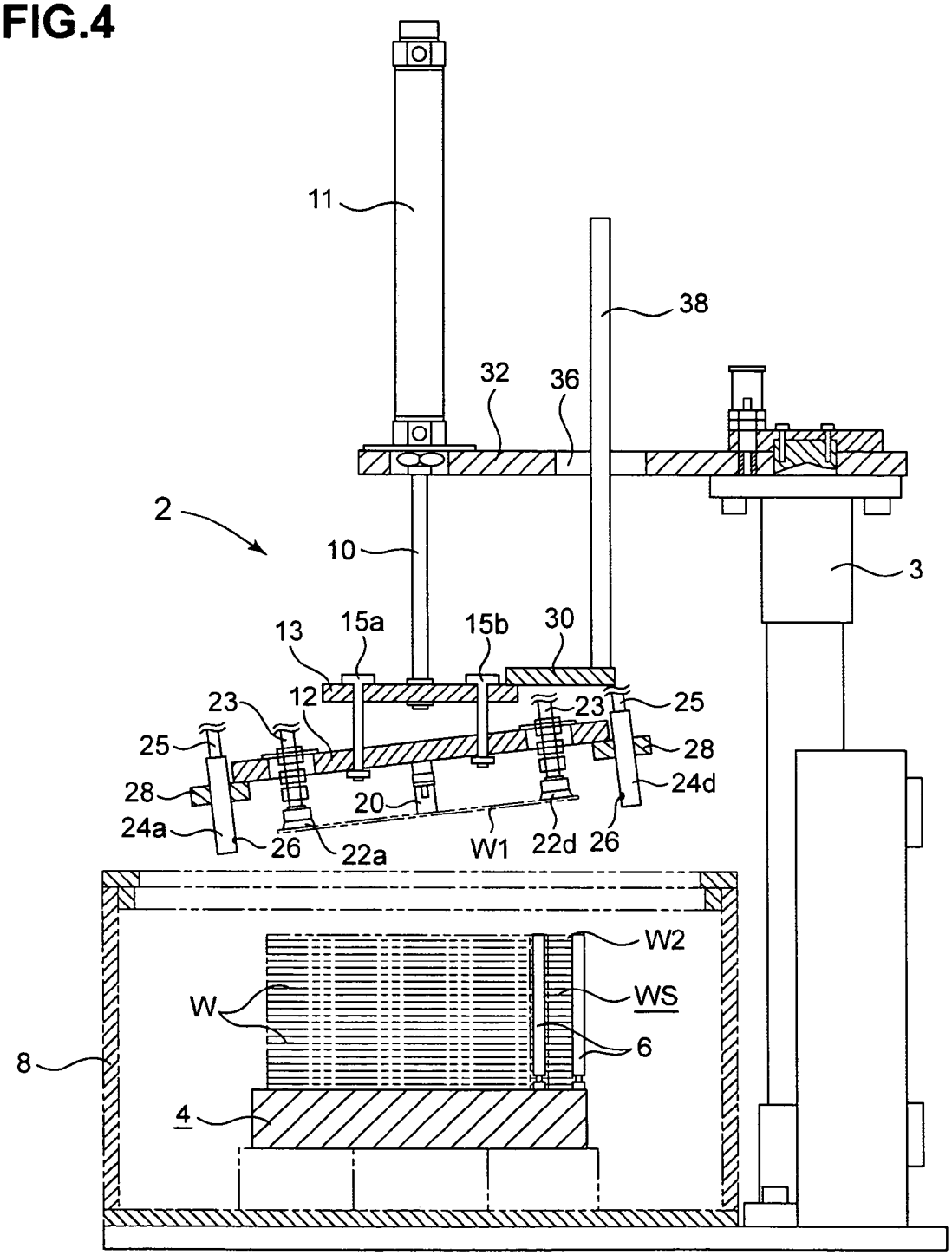
FIG. 4 is a descriptive, partially sectional side view showing a case where a support plate of the wafer release apparatus of the present invention is located at the upper limit position.
Figure 5:
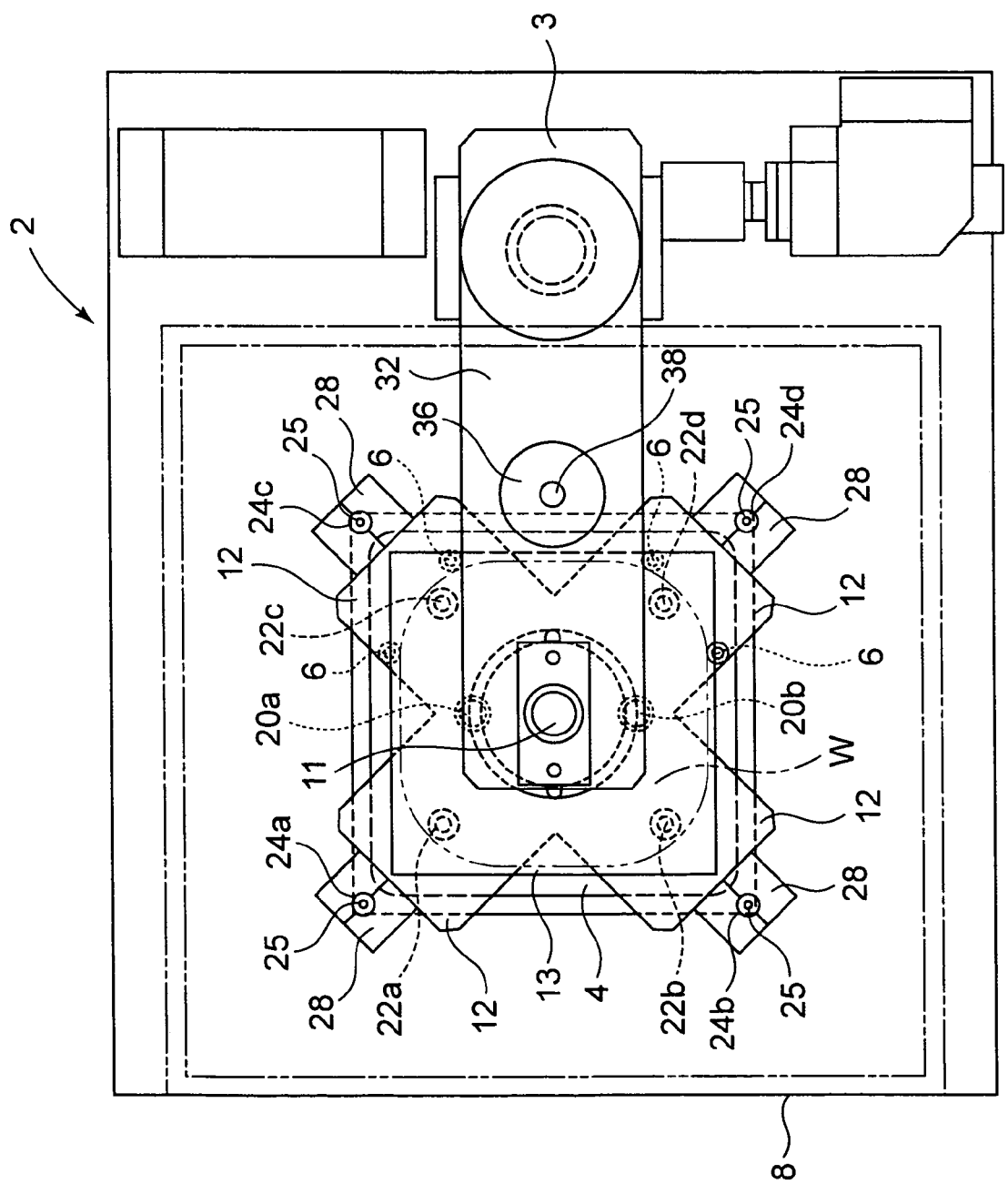
FIG. 5 is a plan view showing the wafer release apparatus of the present invention.

Next, description will be given of a construction of a wafer release apparatus with reference to FIGS. 3 to 5. FIG. 3 is a descriptive, partially sectional side view showing a case where a support plate of the wafer release apparatus of the present invention at a moving down position. FIG. 4 is a descriptive, partially sectional side view showing a case where a support plate of the wafer release apparatus of the present invention is located at the upper limit position. FIG. 5 is a plan view showing the wafer release apparatus of the present invention.

In the figures, a reference symbol 2 indicates a wafer release apparatus according to the present invention. A reference symbol 4 indicates a wafer laminate holding means for holding a wafer laminate WS obtained by laminating many or a plurality of semiconductor wafers, for example, wafers such as silicon wafers. The wafer laminate holding means 4 includes a plurality of holding rods for positioning and holding the wafer laminate WS. A reference symbol 8 indicates a vessel being open at the top portion and the wafer laminate holding means 4 is installed in the central portion thereof. The vessel 8 may be open at the front portion or the side portion when required, which facilitates the wafer laminate WS to be transferred thereinto.

The movable member 10 is provided above the wafer laminate holding means 4 so as to be movable vertically and serves as a cylinder rod of an air cylinder means 11. The movable member 10 serving as the cylinder rod falls by gravity when the air of the air cylinder means 11 is turned off, while it rises when the air of the air cylinder means 11 is turned on.

The support base plate 13 is hung by a plurality of hanging members each having an idle clearance in a vertical direction different from each other so as to be inclined relative to the horizontal direction in a hanging state of the support plate 12. For example, a bolt and nut may be used as the hanging member. In this case, as shown in the figure, there are used the bolts 15a and 15b different in length from each other so as to have respective idle clearances different from each other in the vertical direction. The bolt 15a is designed larger than the bold 15b in terms of the idle clearance, and the support plate 12 is hung so as to be inclined downwardly on the bolt 15a side in a state where the support plate 12 is hung from the support base plate 13. Incidentally, it is needless to say that a construction in which the idle clearances in the vertical direction of the hanging members are different from each other may be changeable in various ways, in one of which the idle clearances are different from each other using springs having different value of elasticity from each other.

No specific limitation is placed on the support plate 12 as far as it is a member longer than a diameter of wafers in length in at least one direction thereof While the support plate 12 may be in the circle shape or the square shape larger in size than the wafer, it has only to be preferably formed in the shape of a cross, a letter of X or a letter of H. In the embodiment in the figure, there is shown the support plate 12 formed in the shape of a cross (see FIG. 5).

Reference symbol 20 indicates a wafer pressing means made of an elastic material, for example, a rubber material, attached on the lower surface of the support plate 12. As stated above, the wafer pressing means 20 presses the uppermost wafer along an axis direction shifted from the wafer crystal habit line axis by an angle in the range of 15 to 75 degrees, preferably 30 to 60 degrees, more preferably 40 to 50 degrees and most preferably 45 degrees clockwise or counterclockwise. The wafer pressing means 20 serves as a support point when the wafer is vacuum chucked in the peripheral portion by the wafer vacuum chuck means 22a to 22d to thereby bend the wafer peripheral portion upwardly. In the embodiment in the figure, the wafer is pressed along a prescribed axis direction with the wafer pressing means 20a and 20b arranged in a prescribed direction as the wafer pressing means 20 (see FIG. 5).

On the peripheral portion of the lower surface of the support plate 12, there are provided the wafer vacuum chuck means 22a, 22b, 22c and 22d for vacuum chucking the wafer at prescribe vacuum chuck positions (4 positions in the figure) (see FIG. 5).

The proximal ends of the wafer vacuum chuck means 22a to 22d are connected by pipes 23 to a vacuum source (not shown) so that the connection can be turned on or off. When the vacuum chuck sections at the distal ends thereof vacuum chuck the wafer, the connection to the vacuum source is turned on to conduct the vacuum chucking, while when conducting no vacuum chucking, the connection to the vacuum source is turned off.

Vacuum chuck nozzles (not shown) for vacuum chucking are provided in the vacuum chuck sections at the distal ends of the wafer vacuum chuck means 22a to 22d. The vacuum chuck nozzles can be equipped with a liquid jet function for jetting a liquid such as water. In this case, the vacuum chuck means are connected to a water supply source (not shown) with pipes 23 so that the connection can be turned on or off and the water supply source can be changed over to the vacuum source. In a case where a liquid is jetted from the vacuum chuck nozzles, the vacuum source is changed over to the water supply source and the connection to the water supply source is turned on to jet the liquid, while in a case where no liquid is jetted, the connection to the water supply source is turned off.

The liquid jet function of the vacuum chuck nozzles serves as follows: the pipes 23 communicating with the vacuum chuck nozzles are contaminated after repetition of vacuum chucking because slurry or the like is left on a wafer to be vacuum chucked by the vacuum chuck nozzles, which leads to malfunction of the vacuum chuck nozzle, and hence the pipes 23 communicating with the vacuum chuck nozzles are cleaned by jetting a liquid such as water through the vacuum chuck nozzles; also, when the uppermost wafer is contaminated by slurry or the like, vacuum chucking with the vacuum chuck nozzle may be unstable, and hence the vacuum chuck positions on the uppermost wafer are cleaned by jetting a liquid such as water through the vacuum chuck nozzles prior to vacuum chucking; and moreover, as stated above, the movable member (the cylinder rod) 10 falls down by gravity and together therewith the wafer vacuum chuck means 22a to 22d having the vacuum chuck nozzles fall down, and if the falling-down is rapid, the vacuum chuck nozzles collide with the wafer, which causes a danger to break the wafer, and hence a liquid is jetted from the vacuum chuck nozzles so that the vacuum chuck nozzles hover temporarily above the surface of the wafer in order to prevent the wafer to be broken.

Reference symbols 24a, 24b, 24c and 24d indicate liquid jet means, which are provided on the peripheral portion of the support plate 12 so as to be located outwardly from the wafer vacuum chuck means 22a, 22b, 22c and 22d corresponding thereto with mounting metal members 28. Fluid jet holes 26 are formed at the respective lower ends of the fluid jet means 24a to 24d. The wafer vacuum chuck means 24a to 24d communicate with the pipes 25 and connected to the water supply source (not shown) and/or the air supply source (not shown) so that the connection can be turned on or off and the change over between water and air can be conducted when required.

The fluid jet means 24a to 24d jet a fluid into a clearance D (see FIG. 2) formed between the lower surface of the uppermost wafer of the wafer laminate WS and the upper surface of the lower wafer adjacent to the lower surface of the uppermost wafer. The fluid to be jetted may be water, air or a mixture of water and air. Preferably, water is jetted for a prescribed time and thereafter the water is changed over to air and the air is jetted. To first jet water has an effect to clean off slurry or the like clinging on a wafer, which facilitates a wafer to be released with more ease than in a case where air is jetted from the beginning. By changing over the water to jet air, the water is blown away by the air jetting more as compared with the water is jetted continuously; therefore there is an effect of reduction in function of the surface tension of water.

Reference symbol 32 indicates a plate attached to the lower end of the air cylinder 11 at its one end and the other end of the plate 32 is connected to a side base body 3. Reference symbol 36 indicates a through-hole formed in the central portion of the plate 32 and a guide rod 38 vertically provided on the support base plate 13 with a connection member 30 is inserted through the through-hole 36 to prevent the support plate. 13 from vibration with the guide rod 38. Incidentally, if no necessity arises for vibration of the support base plate 13, there arises no need for any of the connection member 30, the through-hole 36 and the guide rod 38.

Figure 6:
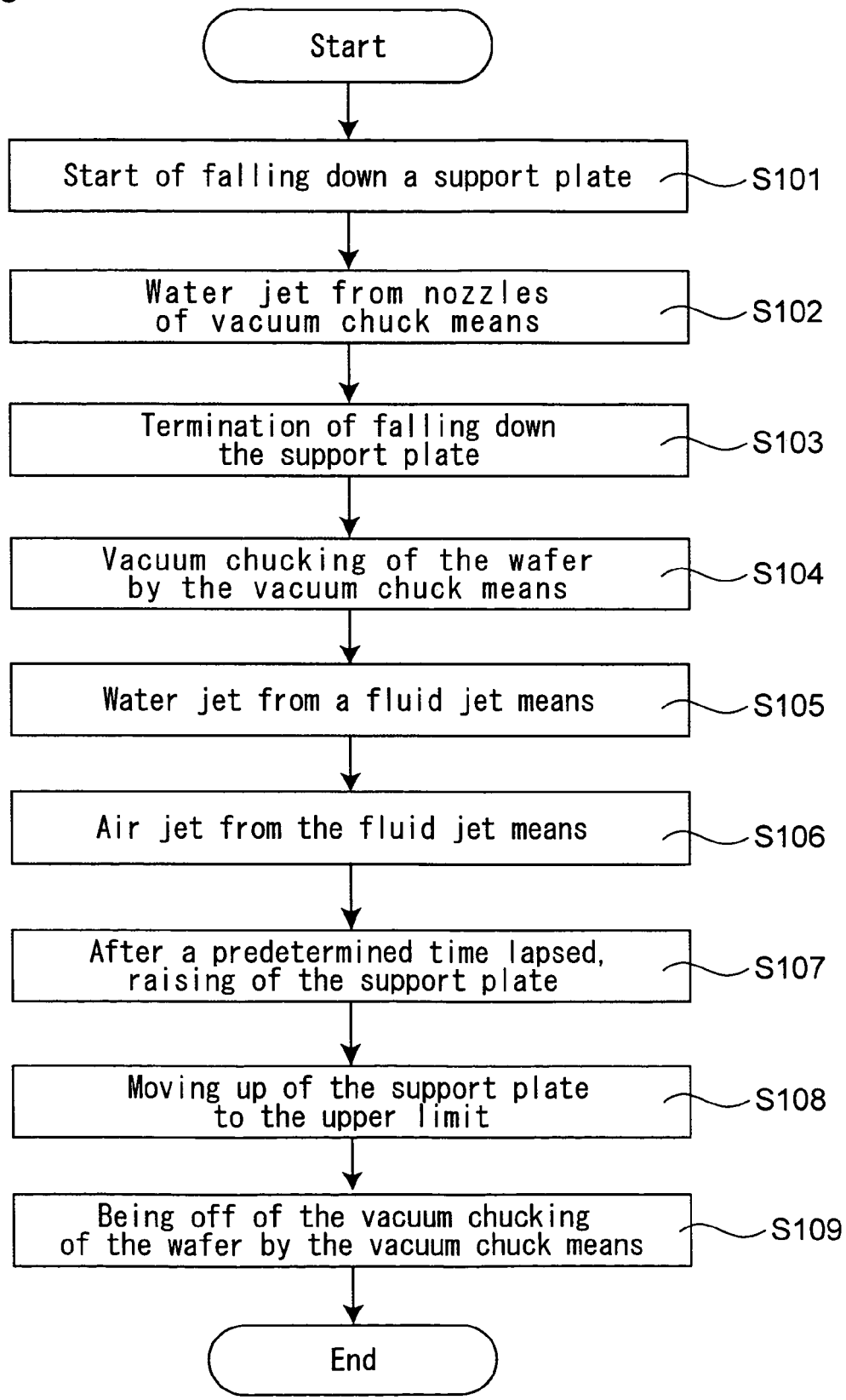
FIG. 6 is a flowchart showing an operation flow in the wafer release apparatus of the present invention.

Then, with the construction described above, description will be given of an operation flow using FIG. 6. FIG. 6 is a flowchart showing the operation flow in the wafer release apparatus of the present invention. First of all, the operation in the wafer release apparatus 2 gets started by turning on a starter means (not shown).

The support plate 12 falls down by gravity with turning off air of the air cylinder 11 (step 101). At the same time as the step, by jetting such a liquid as water or the like from the nozzles of the vacuum chuck means 22a to 22d, the pipes 23 communicating with the nozzles and vacuum chuck positions on the uppermost wafer W1 are cleaned (step 102).

When the wafer pressing means 20 and the wafer vacuum chuck means 22a to 22d provided on the lower surface of the support plate 12 are brought into contact with the uppermost wafer W1, the support plate 12, which is falling down by gravity, automatically stops falling down (step 103). At this time, the uppermost wafer W1 is pressed along an axis direction shifted from the crystal habit line axis by an angle in the range of from 15 to 75 degrees, preferably 30 to 60 degrees, further preferably 40 to 50 degrees and most preferably 45 degrees.

Incidentally, a construction can also be adopted in which a sensor is provided to detect whether or not the support member 12 is brought into contact with the surface of the uppermost wafer W1, and when contact of the support plate 12 with the uppermost wafer W1 is detected, falling-down of the support plate 12 is terminated by a command from the sensor.

Then, the vacuum chuck means 22a to 22d are actuated to vacuum chuck the uppermost wafer W1 in the peripheral portion of the upper surface of the uppermost wafer W1, and thereby the peripheral portion thereof is bent (step 104).

Water is jetted from the fluid jet means 24 into the clearance D (see FIG. 2) formed between the peripheral portion of the uppermost wafer W1 and the peripheral portion of the lower wafer W2 adjacent thereto (step 105). This water jetting cleans off slurry or the like clinging to the wafer to facilitate the wafer to be easily released. For example, the water jetting will be effective at a flow rate of the order in the rage of 0.5 to 1 L/min for a time of the order in the range of 1 to 2 sec.

Next, air is jetted from the fluid jet means 24 into the clearance D (see FIG. 2) formed between the peripheral portion of the uppermost water W1 and the peripheral portion of the lower wafer W2 adjacent thereto (step 106). The air jetting blows away the water due to the water jetting and the surface tension of water is prevented from working when releasing the wafer. For example, the air jetting will be effective at a flow rate of the order in the range of 10 to 30 L/min for a time of the order in the range of 2 to 3 sec.

In such a way, the surface tension between the uppermost water W1 and the lower wafer W2 adjacent thereto becomes extremely low so that they are easily released each other. Then, the support plate 12 is raised while the uppermost wafer W1 is vacuum chucked by the vacuum chuck means 22a to 22d (step 107). On this occasion, since the support plate 12 is raised with an inclination to the horizontal direction, an influence of the surface tension of water is further decreased. The fluid jetting ends at the same time as the raise of the uppermost wafer W1 is started.

The support plate 12 moves up to the upper limit (step 108). The vacuum chucking by the vacuum chuck means 22a to 22d with which the uppermost wafer vacuum chucked is off and the wafer is transferred by a proper means such as a robot arm to the next step (step 109). One cycle of the operation of the wafer release apparatus 2 ends at this time point.

Figure 7:
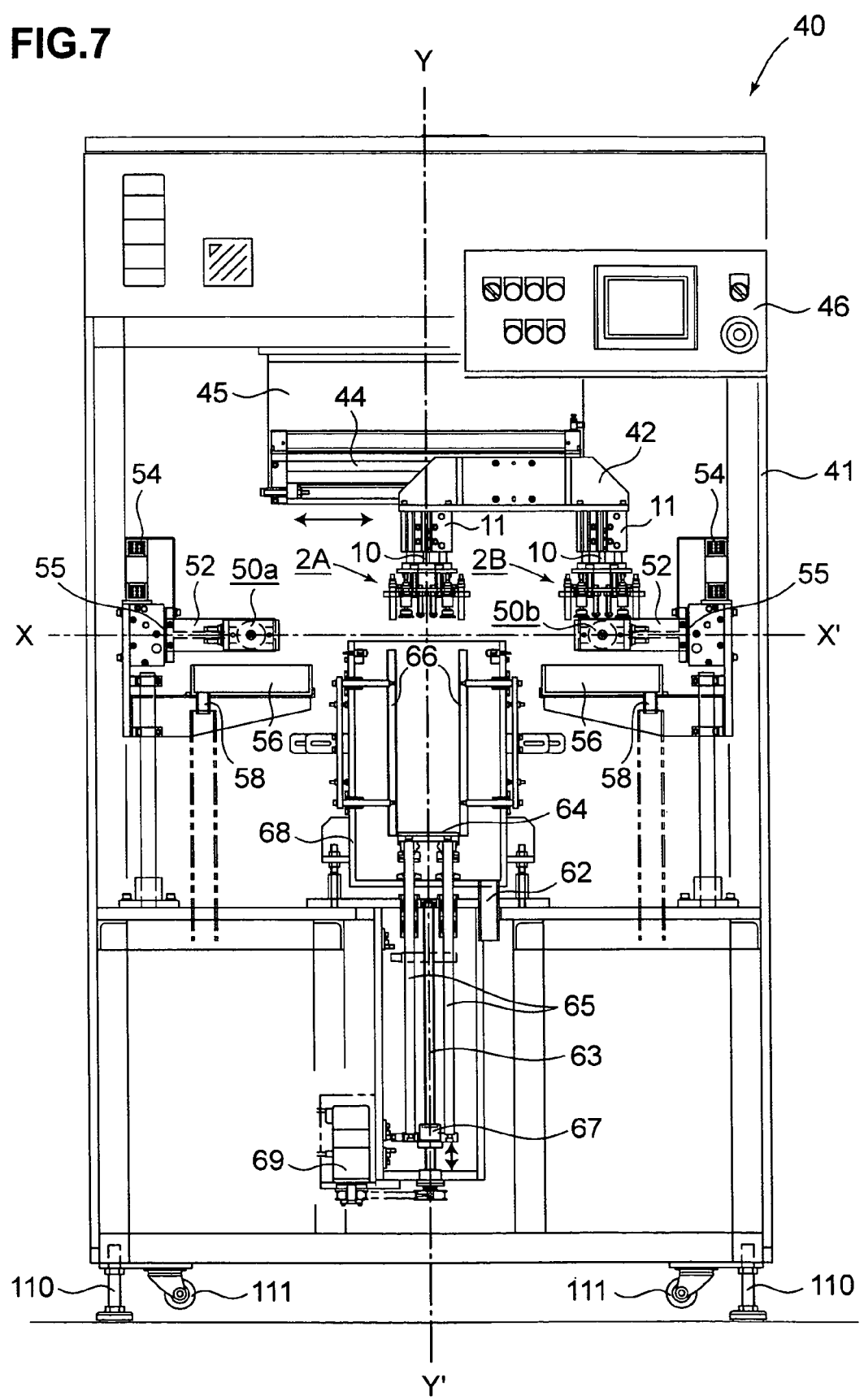
FIG. 7 is a descriptive, front view showing a front side of a wafer release transfer machine of the present invention.
Figure 8:
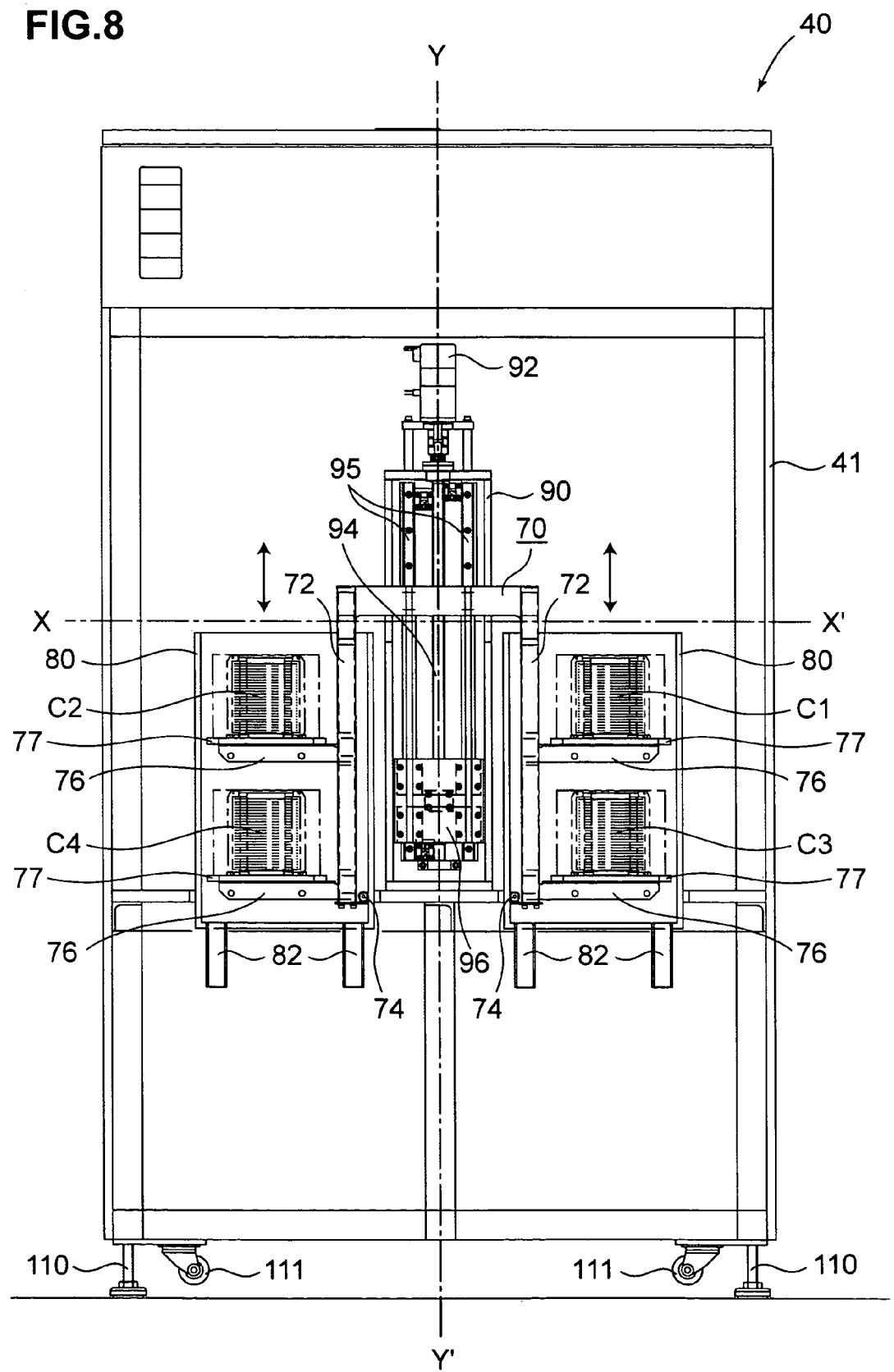
FIG. 8 is a descriptive, back view showing a back side of the wafer release transfer machine of the present invention.
Figure 9:
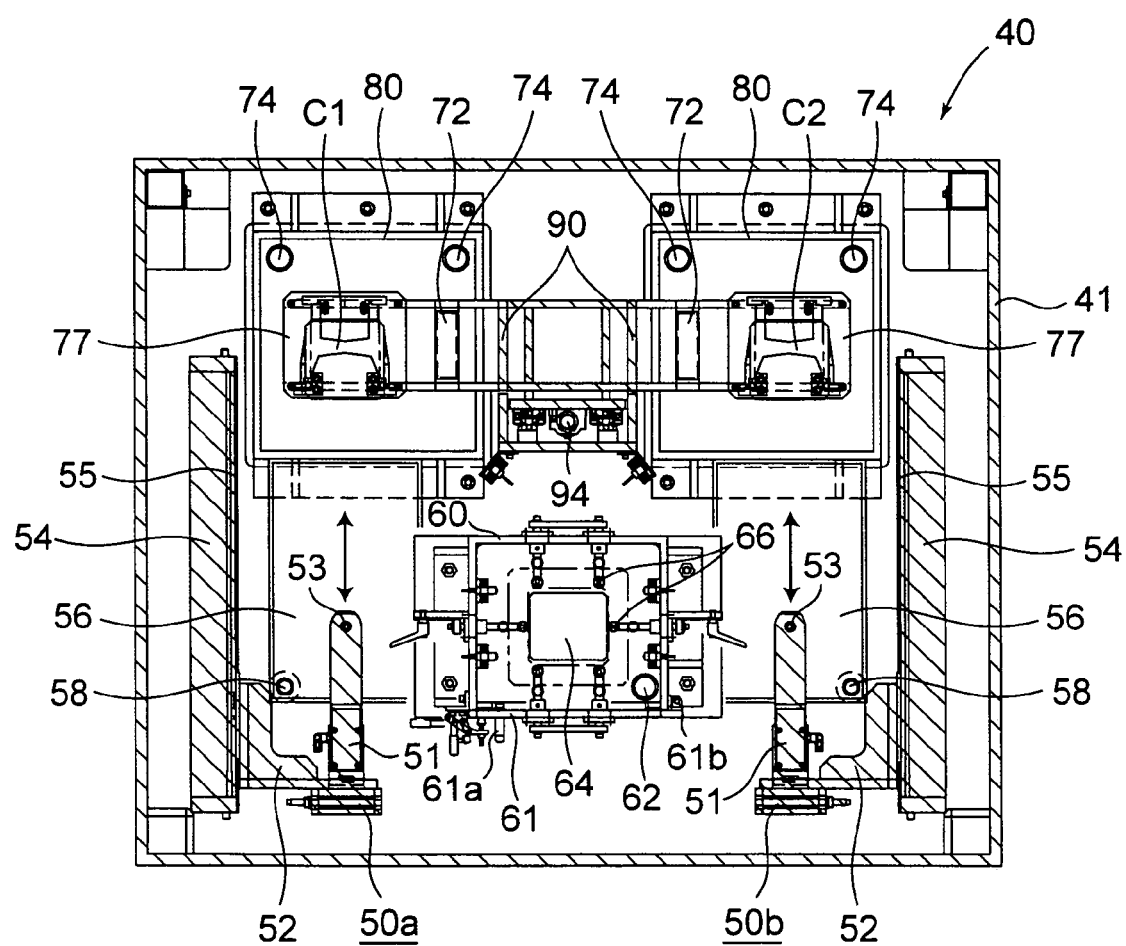
FIG. 9 is a descriptive, plan view using a section taken on a symbol X-X' of a wafer release transfer machine of the present invention.
Figure 10:
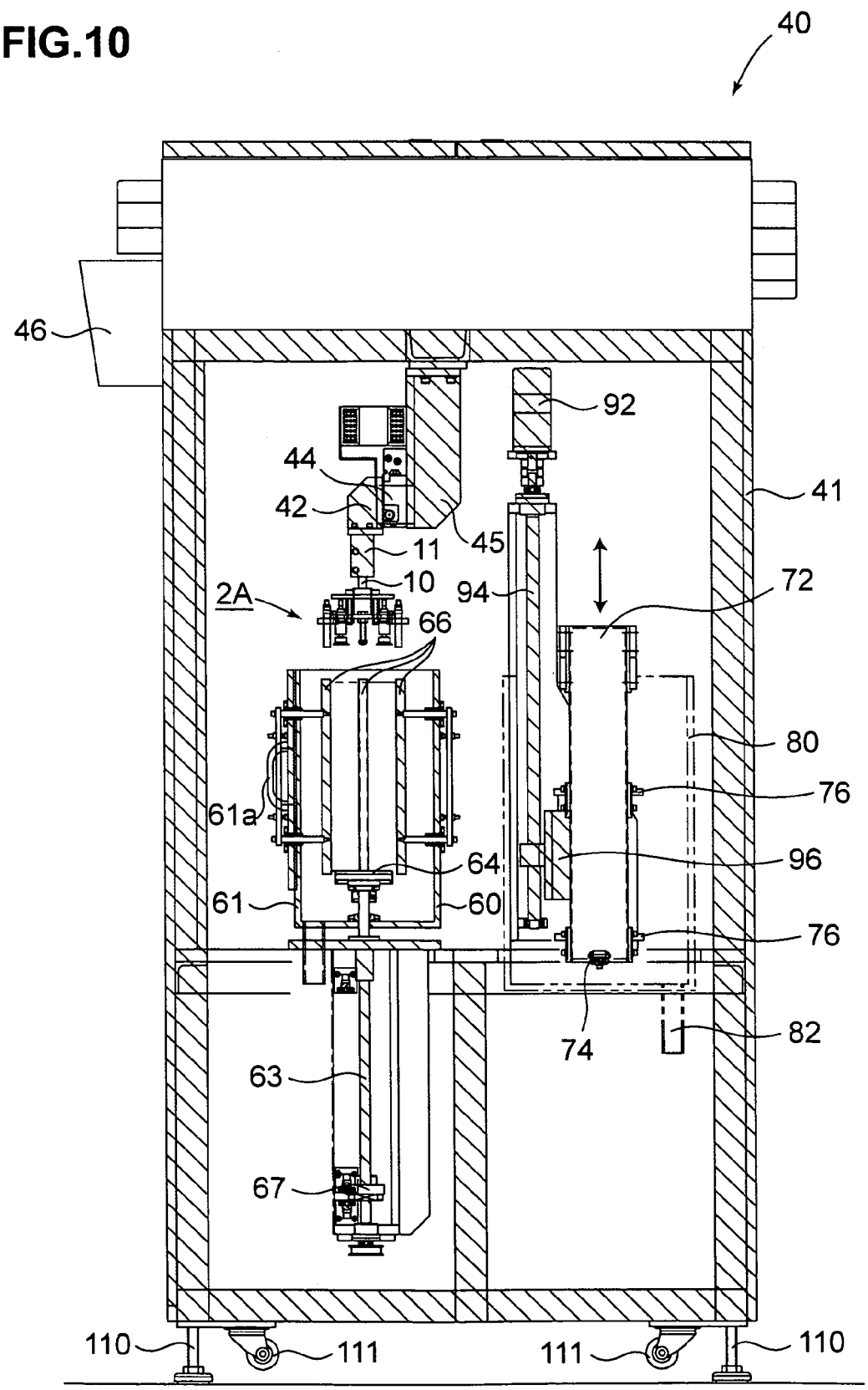
FIG. 10 is a descriptive, side view using a section taken on a symbol Y-Y' of the wafer release transfer machine of the present invention.
Figure 11:
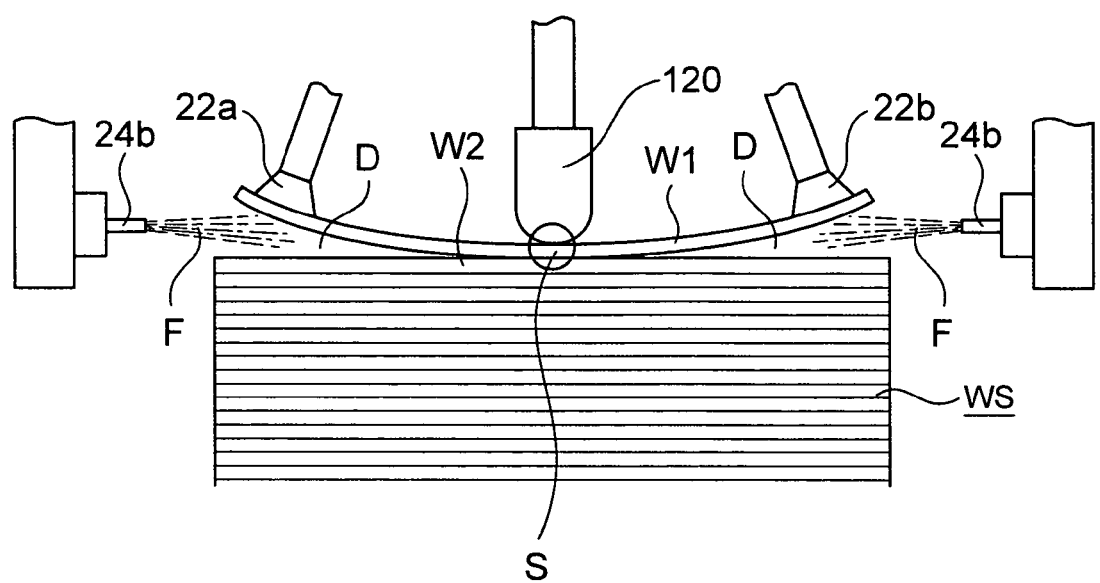
FIG. 11 is a descriptive, conceptual view showing an operation principle of a conventional wafer release apparatus.
Figure 13:
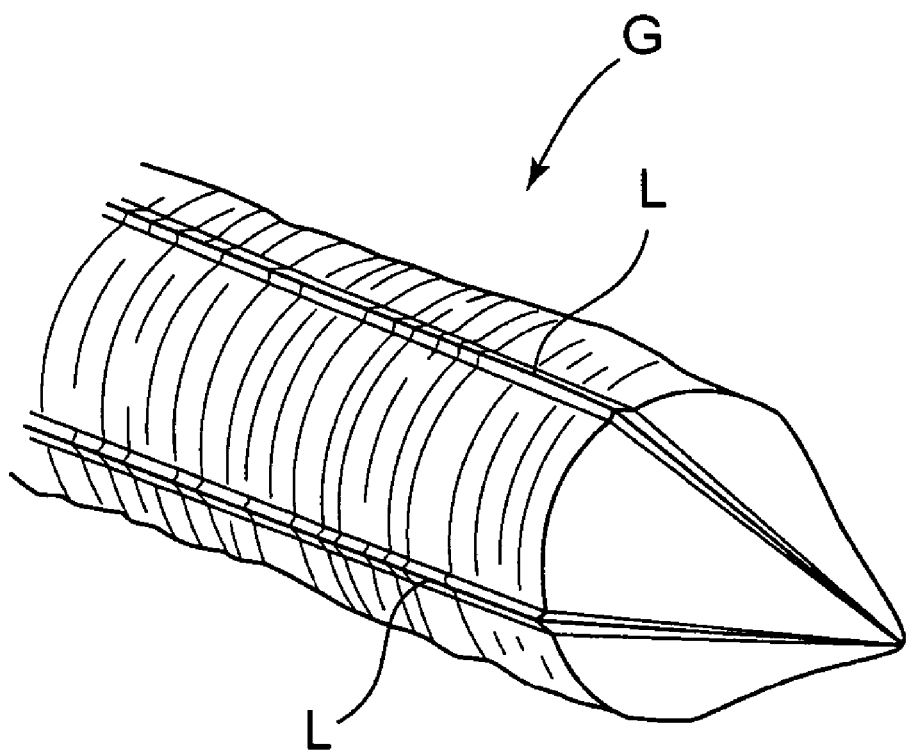
FIG. 13 is a model view showing an outer appearance of crystal graphic lines formed on the outer surface of an ingot.

Then, description will be given of a construction of a wafer release transfer machine using the wafer release apparatus of the present invention with reference to FIGS. 7 to 10. FIG. 7 is a descriptive, front view showing a front side of a wafer release transfer machine of the present invention. FIG. 8 is a descriptive, back view showing a back side of the wafer release transfer machine of the present invention. FIG. 9 is a descriptive, plan view using a section taken on a symbol X-X' of a wafer release transfer machine of the present invention. FIG. 10 is a descriptive, side view using a section taken on a symbol Y-Y' of the wafer release transfer machine of the present invention.

In the figures, reference symbol 40 indicates a wafer release transfer machine according to the present invention. The wafer release transfer machine 40 has a case 41 and equipments described below are installed in the case 41. The case 41 includes a console panel 46, support legs 110 and casters 111.

The support table 45 is vertically hung from an internal ceiling portion of the case 41. In the support table 45 rails 44 are formed in the horizontal direction. A base frame 42 is slidably provided along the rails 44. The air cylinders 11 and 11 are vertically hung from the left and right lower end portions of the base frame 42. The wafer release means 2A and 2B each constituted of the wafer release apparatus 2 of the present invention are attached to the lower ends of the movable members 10 and 10.

A wafer laminate holding means 64 for holding a wafer laminate, which is an object to be processed, is placed in the central portion of the front side in the case 41. The wafer laminate holding means 64 has a plurality of holding rods 66 for positioning and holding the wafer laminate. A vessel 68 surrounding the wafer laminate holding means 64 is open at the top thereof and the forward side (the front side) thereof is provided with an openable door, 61 (see FIGS. 9 and 10). The door 61 has a handle 61a and is openable with a hinge 61b. The vessel 68 is provided with a drainage hole 62 at the bottom thereof and the water used in cleaning off the wafer is drained therethrough.

The lower portion of the wafer laminate holding means 64 are connected to the movable rod 65 that is movable vertically. The movable rod 65 is connected to an engaging member 67 for engaging with a screw shaft 63. The screw shaft 63 is rotation driven by a motor 69 through a transmission belt and a pulley. Accordingly, by forward rotation driving or backward rotation driving of the screw shaft 63, the movable rod 65 moves upwardly or downwardly together with the engaging member 67. With such a construction adopted, the higher position or lower position of the wafer laminate holding means 64 can be adjusted to a position where the wafer releasing operation is easily conducted by the wafer release means 2A and 2B in proportion to the number of wafers held in the wafer laminate holding means 64.

Reference symbols 50a and 50b indicate the wafer transfer means and each of the wafer transfer means 50a and 50b is equipped with the plate member 51 in the shape of a rectangular thin plate and a vacuum chuck section 53 at its distal end. The plate member 51 is rotatable by 180 degrees around the axial length direction. Each of the wafer transfer means 50a and 50b is equipped with a reciprocating mechanism 54 for reciprocating the plate member 51 in the horizontal direction, toward forward side (front side) or backward side (back side). The reciprocating mechanism 54 is equipped with rails 55 in the length direction. A slide member 52 is slidably attached to each of the rails 55. The slide member 52 and the plate member 51 are connected to each other.

With such a construction, the wafer transfer means 50*a* and 50*b* receive and vacuum chuck wafers from the wafer release means 2A and 2B at the vacuum chuck sections 53. The vacuum chucked wafers are reversed by 180 degrees, and thereafter are moved to the wafer cassettes C. There, the vacuum chuck of the wafers is off, and thereby the wafers released from the wafer release means 2A and 2B can be transferred to the wafer cassettes C.

Incidentally, the wafer receivers 56 are placed below the wafer transfer means 50. In a case where the wafers released by the wafer release means 2A and 2B are broken and fall down when they are received by the wafer transfer means 50*a* and 50*b*, the broken wafers are received in the wafer receivers 56. The drainage holes 58 are also formed in the wafer receivers 56 to drain extra water therethrough.

Reference symbol 70 indicates a wafer accommodating cassette placing means. Side plates 72 are provided on the both side surfaces of the wafer accommodating cassette placing means 70. Cassette placing plates 77 are attached to support arms 76 protruding outwardly from the side plates 72, respectively. The wafer accommodating cassettes C1, C2, C3 and C4 are placed on the respective cassette placing plates 77. Incidentally, the wafer accommodating cassettes C1, C2, C3 and C4 are each provided with tens of shelves each accommodating one wafer.

The wafer accommodating cassette placing means 70 is movable vertically by a vertically moving mechanism 90. The vertically moving mechanism 90 includes: a screw shaft 94; a motor for rotation driving the screw shaft 94; rails 95 provided on the both sides along the screw shaft 94; and engaging member 96 for engaging with the screw shaft 94 and movable slidably on the rails 95, wherein the wafer accommodating cassette placing means 70 is connected to the engaging member 96. Therefore, if the screw shaft 94 is forward rotation driven or backward rotation driven to thereby raise or lower the engaging member 96, the wafer accommodating cassette placing means 70 is also raised and lowered. Incidentally, wheels 74 are preferably attached to the lower portions of the side plates 72 so that the wafer accommodating cassette placing means 70 is easily slidable on the inner side surfaces of the immersion bath 80.

The immersion bath 80 is provided so that in a case where the wafer accommodating cassette placing means 70 is located at the lowest position, all the wafer cassettes C1, C2, C3 and C4 are immersed in a liquid. With the immersion bath 80 filled with pure water or a chemical liquid, it is highly convenient to prevent the wafer from contamination and clean it. Pipes 82 are used for feeding or draining pure water, a chemical liquid or the like to or from the immersion baths 80.

Description of an operation of the wafer release transfer machine according to the present invention with such a construction is shown below. Incidentally, at an initial stage, the wafer accommodating cassette placing means 70 is disposed at an uppermost position (a position where the wafer is not immersed in the immersion bath 80).

1) At first, the uppermost wafer is vacuum chucked and released from the wafer laminate held on the wafer laminate holding means 64 by the wafer release means 2A (S101 to S108 in FIG. 6).
2) The wafer release means 2A temporarily awaits in a state where the wafer is vacuum chucked, the base frame 42 slides in a direction toward the wafer transfer means 50*a* along the rails 44 and the wafer vacuum chucked by the wafer release means 2A is moved to a position in the vicinity above the vacuum chuck section 53 of the wafer transfer means 50*a*.
3) The vacuum chucking of the wafer in the wafer release means 2A is off (S109 of FIG. 6) and the wafer is vacuum chucked with the vacuum chuck section 53 of the wafer transfer means 50*a*. The plate member 51 is reversed by 180 degrees while the wafer is vacuum chucked at the vacuum chuck section 53. That is, the vacuum chuck section 53 is rotated from a state where the vacuum chuck section 53 faces upwardly to another state where the vacuum chuck section 53 faces downwardly.
4) On the other hand, in the process 3), the uppermost wafer is vacuum chucked from the wafer laminate by the wafer release means 2B (S101 to S108 in FIG. 6).
5) The wafer release means 2B temporarily awaits in a state where the wafer is vacuum chucked, the base frame 42 slides in a direction toward the wafer transfer means 50*b* along the rails 44 and the wafer vacuum chucked by the wafer release means 2B is moved in the vicinity above the vacuum chuck section 53 of the wafer transfer means 50*b*.
6) The vacuum chucking of the wafer in the wafer release means 2B is off (S109 of FIG. 6) and the wafer is vacuum chucked with the vacuum chuck section 53 of the wafer transfer means 50*b*. The plate member 51 is reversed by 180 degrees 53 while the wafer is vacuum chucked at the vacuum chuck section 53. That is, the vacuum chuck section 53 is rotated from a state where the vacuum chuck section 53 faces upwardly to another state where the vacuum chuck section 53 faces downwardly.
7) In the process 6), the wafer transfer means 50*a* slides to a position in the vicinity of the front of the wafer accommodating cassette along the rails 55 while the vacuum chuck 53 faces downwardly and vacuum chucks the wafer. The distal end portion of the plate member 51 is inserted into a prescribed shelf of the wafer accommodating cassette C1. There, the vacuum chucking of the wafer by the vacuum chuck section 53 is off and then the wafer is transferred onto the prescribed shelf of the wafer accommodating cassette C1. Together with this operation, in the wafer release apparatus 2A, the uppermost wafer is released from the wafer laminate in a similar way to that in the process 1).
8) In a similar way to that in the process 2), the wafer release means 2A temporarily awaits in a state where the wafer is vacuum chucked. The base frame 42 slides in a direction toward the wafer transfer means 50*a* along the rails 44 and the wafer vacuum chucked by the wafer release means 2A is moved to a position in the vicinity above the vacuum chuck section 53 of the wafer transfer means 50*a*.
9) In a similar way to that in the process 3), the vacuum chucking of the wafer in the wafer release means 2A is off (S109 of FIG. 6) and the wafer is vacuum chucked with the vacuum chuck section 53 of the wafer transfer means 50*a*. The plate member 51 is reversed by 180 degrees while the wafer is vacuum chucked at the vacuum chuck section 53. That is, the vacuum chuck section 53 is rotated from a state where the vacuum chuck section 53 faces upwardly to a state where the vacuum chuck section 53 faces downwardly.
10) In the process 9), the wafer transfer means 50*b* slides to a position in the vicinity of the front of the wafer accommodating cassette C2 along the rails 55 while the vacuum chuck 53 faces downwardly and vacuum chucks the wafer. The distal end portion of the plate member 51 is inserted into the prescribed shelf of the wafer accommodating cassette C2. There, the vacuum chucking of the wafer by the vacuum chuck section 53 is off and then the wafer is transferred onto the prescribed shelf of the wafer accommodating cassette C2. Together with this operation, in the wafer release apparatus 2B, the uppermost wafer is released from the wafer laminate in a similar way to that in the process 4).

11) The wafer accommodating cassette placing means 70 is moved downwardly so that the prescribed shelves of the wafer accommodating cassettes C1 and C2 are raised by one level.

Thereafter, the above processes are sequentially repeated and the wafers released one after another from the wafer laminates can be transferred into the wafer accommodated cassette C1, C2, C3 and C4.

Incidentally, in the above description of the wafer release transfer machine of the present invention, there is exemplified a preferable embodiment in view of processing capability and convenience of the system where the two wafer release means 2A and 2B are provided with respective two wafer release apparatus 2 of the present invention, two wafer transfer means 50a and 50b and others, while if down sizing is preferable rather than processing capability, one wafer release means may be enough and if large processing capability is desired, it is needles to say that three or more wafer release means are is preferable.

CAPABILITY OF EXPLOITATION IN INDUSTRY

According to the present invention, as described above, there can be exerted a great effect to provide a wafer release method capable of releasing a wafer safely, simply and certainly, and improving a wafer releasing rate, a wafer release apparatus and a wafer release transfer machine using the wafer release apparatus.

The invention claimed is:

1. A wafer release method in which an uppermost wafer is released from a wafer laminate obtained by laminating a plurality of wafers, the method comprising the steps of:
   providing an uppermost wafer, said uppermost wafer having a defined edge, said uppermost wafer having a first vacuum position located at a first spaced location from said edge, said uppermost wafer having a second vacuum position located at a second spaced location from said edge, said first vacuum position being opposite said second vacuum position such that the alignment of said first vacuum position and said second vacuum position define a crystal habit line axis;
   defining an uppermost wafer pressing axis along said uppermost wafer, said uppermost wafer pressing axis being offset at an angle with respect to said crystal habit line axis, said angle being 45 degrees clockwise or counterclockwise with respect to said crystal habit line axis;
   pressing the uppermost wafer along said uppermost wafer pressing axis;
   bending upwardly a peripheral portion of the uppermost wafer such that a bending stress is provided along said uppermost wafer pressing axis;
   blowing a fluid into a space defined by a lower surface of the uppermost wafer and an upper surface of a lower wafer adjacent thereto; and
   raising the uppermost wafer for releasing.

2. The wafer release method according to claim 1, wherein when raising and releasing the uppermost wafer, the uppermost wafer is raised in an inclined position relative to a horizontal direction.

3. A wafer release apparatus for releasing the uppermost wafer from a wafer laminate obtained by laminating a plurality of wafers, the apparatus comprising:
   an uppermost wafer having a defined upper surface, said uppermost wafer having a plurality of vacuum chuck positions located along a peripheral portion of said upper surface, one vacuum chuck position being located opposite another vacuum chuck position, whereby the alignment of each pair of chuck positions defines a crystal habit line axis;
   a support plate mounted for movement such that said support plate is moveable in a vertical direction, said support plate having a lower surface;
   a wafer pressing means provided on the lower surface of said support plate;
   a wafer vacuum chuck means provided on a peripheral portion of the lower surface of the support plate for engaging one or more said vacuum chuck positions; and
   a fluid jet means positioned at a spaced location from said wafer vacuum chuck means such that said fluid jet means is aligned with said wafer vacuum chuck means, wherein the uppermost wafer is pressed via said wafer pressing means such that said wafer pressing means engages the uppermost wafer at a location offset from said crystal habit line axis to define a wafer pressing axis, whereby said wafer pressing axis is offset by an angle being 45 degrees clockwise or counterclockwise with respect to said crystal habit line axis of the uppermost wafer, said uppermost wafer being bent upwardly at one or more said vacuum chuck positions via said vacuum chuck means such that a bending stress is applied along said wafer pressing axis, whereby a fluid is blown into a space defined by a lower surface of the uppermost wafer and an upper surface of a lower wafer adjacent thereto via said fluid jet means, said uppermost wafer being raised for releasing.

4. The wafer release apparatus according to claim 3, wherein the wafer pressing means is constituted of a plurality of wafer pressing members provided in one direction on the lower surface of the support plate.

5. The wafer release apparatus according to claim 3, wherein the wafer pressing means is constituted of a long wafer pressing member provided in one direction on the lower surface of the support plate.

6. The wafer release apparatus according to claim 3, wherein two or more pairs of wafer vacuum chuck means are provided, wherein the uppermost wafer is vacuum chucked by the vacuum chuck means on the peripheral portion of the upper surface thereof at two or more pairs of said vacuum chuck positions such that the uppermost wafer is bent upwardly at two or more pairs of said vacuum chuck positions.

7. The wafer release apparatus according to claim 3, wherein the support plate is formed in the shape of a cross, a letter X or a letter H and the wafer vacuum chuck means is provided on the peripheral portion of the lower surface of the support plate.

8. The wafer release apparatus according to claim 3, wherein the support plate is provided so as to be inclined relative to a horizontal direction while being moved upwardly.

9. The wafer release apparatus according to claim 3, wherein the fluid is water and/or air.

10. The wafer release apparatus according to claim 3, wherein the fluid is water and air and they are alternately blown at prescribed time intervals.

11. The wafer release apparatus according to claim 3, wherein the wafer vacuum chuck means is a vacuum chuck nozzle with a liquid jet function and a liquid is jetted from the vacuum chuck nozzle to clean the vacuum chuck positions on the uppermost wafer of the wafer laminate.

12. The wafer release apparatus according to claim 3, wherein the wafer vacuum chuck means is a vacuum chuck nozzle with a liquid jet function, and a liquid is jetted from the vacuum chuck nozzle to clean a pipe communicating with the vacuum chuck nozzle.

13. The wafer release apparatus according to claim 3, wherein the wafer vacuum chuck means is a vacuum chuck nozzle with a liquid jet function, whereby a liquid is jetted from the vacuum chuck nozzle and the wafer vacuum chuck means temporarily hovers above the wafer surface.

14. A wafer release transfer machine comprising:
one or more units, each unit having a wafer release apparatus, said wafer release apparatus comprising:
an uppermost wafer having a defined upper surface, said uppermost wafer having a plurality of vacuum chuck positions located along a peripheral portion of said upper surface, one vacuum chuck position being located opposite another vacuum chuck position, whereby the alignment of each pair of chuck positions defines a crystal habit line axis;
a support plate mounted for movement such that said support plate is moveable in a vertical direction, said support plate having a lower surface;
a wafer pressing means provided on the lower surface of said support plate;
a wafer vacuum chuck means provided on a peripheral portion of the lower surface of the support plate for engaging one or more said vacuum chuck positions; and
a fluid jet means positioned at a spaced location from said wafer vacuum chuck means such that said fluid jet means is aligned with said wafer vacuum chuck means, wherein the uppermost wafer is pressed via said wafer pressing means such that said wafer pressing means engages said uppermost wafer at a location offset from said crystal habit line axis to define a wafer pressing axis, whereby said wafer pressing axis is offset by an angle being 45 degrees clockwise or counterclockwise from said crystal habit line axis of the uppermost wafer, said uppermost wafer being bent upwardly at one or more said vacuum chuck positions via said vacuum chuck means such that a bending stress is applied along said wafer pressing axis, whereby a fluid is blown into a space defined by a lower surface of the uppermost wafer and an upper surface of a lower wafer adjacent thereto via said fluid jet means, said uppermost wafer being raised for releasing;
a wafer laminate holding means for holding a wafer laminate obtained by laminating a plurality of said wafers;
a wafer accommodating cassette;
a wafer transfer means for receiving one of said wafers released by the wafer release apparatus and for transferring the received wafer to said wafer accommodating cassette; and
a wafer accommodating cassette placing means for moving the wafer accommodating cassettes, said wafer accommodating cassette placing means being mounted for movement such that said wafer accommodating cassette placing means is vertically movable.

15. The wafer release transfer machine according to claim 14, further comprising:
two wafer release apparatuses, each wafer release apparatus having said wafer transfer means and said wafer accommodating cassette placing means, wherein while one of the two wafer release means performs the release operation, the other wafer release means transfers the released wafer to the wafer transfer means.

16. The wafer release transfer machine according to claim 14, wherein an immersion bath is provided such that the wafer accommodating cassettes are immersed in a liquid when the wafer accommodating cassette placing means is located at the lowest position.

* * * * *